(12) United States Patent
Tripathi et al.

(10) Patent No.: US 8,258,819 B2
(45) Date of Patent: Sep. 4, 2012

(54) LATCHED COMPARATOR HAVING ISOLATION INDUCTORS

(75) Inventors: Vaibhav Tripathi, Stanford, CA (US); Marco Corsi, Parker, TX (US); Venkatesh Srinivasan, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/911,456

(22) Filed: Oct. 25, 2010

(65) Prior Publication Data

US 2012/0098572 A1 Apr. 26, 2012

(51) Int. Cl.
*G11C 27/02* (2006.01)
(52) U.S. Cl. .................. 327/94; 327/91; 327/57; 327/64
(58) Field of Classification Search ....................... 327/91, 327/94, 57, 64
See application file for complete search history.

(56) References Cited

U.S. PATENT DOCUMENTS

| | | | | |
|---|---|---|---|---|
| 6,340,899 B1 * | 1/2002 | Green | ........................... | 326/115 |
| 6,559,693 B2 * | 5/2003 | Tung et al. | .................... | 327/115 |
| 6,614,371 B2 * | 9/2003 | Zhang | ........................... | 341/101 |
| 6,774,721 B1 * | 8/2004 | Popescu et al. | ............... | 330/253 |
| 6,777,988 B2 * | 8/2004 | Tung et al. | .................... | 327/115 |
| 6,909,309 B2 * | 6/2005 | Green | ........................... | 326/115 |
| 7,302,461 B2 * | 11/2007 | Mukherjee et al. | ........... | 708/819 |
| 2005/0264356 A1 * | 12/2005 | Kucharski et al. | ............ | 330/252 |
| 2006/0166640 A1 * | 7/2006 | Kim | .......................... | 455/343.1 |
| 2008/0079497 A1 * | 4/2008 | Fang et al. | .................... | 330/302 |
| 2008/0191770 A1 * | 8/2008 | Nedovic et al. | ............... | 327/212 |
| 2009/0021283 A1 * | 1/2009 | Payne et al. | ...................... | 327/63 |

FOREIGN PATENT DOCUMENTS

JP 03145330 6/1991

OTHER PUBLICATIONS

"Design Techniques for High Performance CMOS Flash Analog-to-Digital Converters," Proceedings of the 2005 European Conference on Circuit Theory and Design, Oct. 31, 2005, vol. 1, pp. 131-134 (Sunghyun Park and Michael P. Flynn).
"A 3.5GS/s 5-b Flash ADC in 90 nm CMOS," IEEE 2006 Custom Integrated Circuits Conference (CICC), pp. 489-492 (Sunghyun Park; Palaskas, Y.; Ravi, A.; Bishop, R.E.; and Flynn, M.P.).
"A 4GS/s 4b Flash ADC in 0.18 μm CMOS," IEEE Journal of Solid-State Circuits, Sep. 2007, vol. 42, No. 9, pp. 1865-1872 (Park, S.; Palaskas, Y.; Flynn, M.P.).

* cited by examiner

*Primary Examiner* — Ryan Jager
(74) *Attorney, Agent, or Firm* — John J. Patti; Wade J. Brady, III; Frederick J. Telecky, Jr.

(57) ABSTRACT

Traditionally, latched comparators have suffered from performance problems related to exposure of the latch to load capacitances. Even attempts to isolate the latch from the load capacitances by way of resistors has resulted in performance problems (namely, voltage swing degradation). Here, however, a latched comparator is provided that employs inductors to generally provide isolation from load capacitances, which generally improves performance. Moreover, the latch has been modified to accommodate the inductors during a track period (namely, provision of grounding paths).

7 Claims, 3 Drawing Sheets

LATCHED COMPARATOR HAVING ISOLATION INDUCTORS

TECHNICAL FIELD

The invention relates generally to a latched comparator and, more particularly, to latching comparator having isolation inductors.

BACKGROUND

Turning to FIG. 1, an example of a conventional latched comparator 100 can be seen. This latched comparator 100 generally comprises a pre-amplifier 104, latch 106, inductors L1 and L2, and resistors R1 and R2. The pre-amplifier 104 generally comprises a pair of differential input transistors Q3 and Q4 (which can be NMOS transistors), isolation transistors Q1 and Q2 (which can be NMOS transistors), and a bias transistor Q5 (which can be an NMOS transistor). The latch 106 generally comprises cross-coupled transistors Q6 and Q7 (which can be NMOS transistors) and a switching transistor Q8 (which can be an NMOS transistors).

In operation, the latched comparator 100 tracks the differential input signals INP and INM of the pre-amplifier 104 during a track phase of a latch signal LATCH and holds or latches the differential output signals OUTP and OUTM of the pre-amplifier 104 during a hold phase of a latch signal LATCH. Namely, the pre-amplifier 104 amplifies the difference between the differential input signals INP and INM to generate the differential output signal OUTP and OUPM (where the difference between signals OUTP and OUTM tracks the difference between signals INP and INM). These differential output signals OUTP and OUTM are provided to load 102 (which can be capacitive and which is represented, for example, by capacitors CL). When the latch signal LATCH becomes logic high or "1", switching transistor Q8 activates latch 106 so that the pair of cross-coupled transistors Q6 and Q7 can hold or latch the differential output signals OUTP and OUTM of pre-amplifier 104. To improve the track bandwidth and to improve the latch time during regeneration, inductors L1 and L2 are provided, which generally provide shunt peaking in the tracking phase (i.e., when the latch signal LATCH is logic low or "0"). A problem with this configuration, however, is that the latch 106 sees or is directly exposed to load capacitances (i.e., capacitors CL).

Latched comparator 200 of FIG. 2, on the other hand, attempts to solve this problem by introducing resistors R3 and R4 between the output terminals of the pre-amplifier 104 and the latch 106. These resistors R3 and R4 generally isolate the latch 106 from load capacitances (i.e., capacitors CL), but there is a voltage drop that occurs as a result of the inclusion of resistors R3 and R4. Namely, resistors R3 and R4 reduce the voltage swing from latch 106 (i.e., the difference between voltages VLM and VLP) to the output terminals of pre-amplifier 104 (i.e., difference between signals OUTP and OUTM, which are generally voltages).

Therefore, there is a need for a latched comparator with improved performance.

Some other conventional circuits are: U.S. Patent Pre-Grant Publ. 2009/0021283; Japanese Patent Publ. No. JP03-145330; Park et al., "Design Techniques for high Performance CMOS Flash Analog-to-Digital Converters," *Proceedings of the* 2005 *European Conference on Circuit Theory and Design,* 2005, Vol. 1, pgs. 131-134, Oct. 31, 2005; Park et al., "A 3.5GS/s 5-b Flash ADC in 90 nm CMOS," IEEE 2006 *Custom Integrated Circuits Conference (CICC),* pgs. 489-492; and Park et al., "A 4GS/s 4-b Flash ADC in 0.18-μm CMOS," *IEEE J. of Solid-State Circuits,* Vol. 42, No. 9, pgs. 1865-1872, September 2007.

SUMMARY

A preferred embodiment of the present invention, accordingly, provides an apparatus. The apparatus comprises a series-shunt amplifier having a plurality of input terminals, a plurality of output terminals, a first set of inductors, and a second set of inductors, wherein the input terminals receive a differential input signal, and wherein the first set of inductors provide shut peaking in a tracking phase; and a latch that is coupled to the second set of inductors, wherein the second set of inductors are adapted to isolate the latch from a load capacitance, wherein the latch includes a plurality of grounding transistors that are each associated with at least one inductor from the second set of inductors so as to provide a path to ground for each inductor from the second set in the tracking phase.

In accordance with a preferred embodiment of the present invention, the apparatus further comprises a voltage rail, and wherein the series-shunt amplifier further comprises a pre-amplifier having the input terminals and the output terminals, wherein the each inductor from the first set of inductors is coupled between at least one of the output terminals and the voltage rail.

In accordance with a preferred embodiment of the present invention, each inductor from the second set of inductors is coupled between at least one of the output terminals and the latch.

In accordance with a preferred embodiment of the present invention, the latch further comprises: a pair of cross-coupled transistor that are each coupled to at least two of the inductors from the second set of inductors; and a switching transistor that is coupled to the pair of cross-coupled transistors, wherein the switching transistor receives a latch signal so as to activate the latch during a hold phase and deactivate the latch during the tracking phase.

In accordance with a preferred embodiment of the present invention, an apparatus is provided. The apparatus comprises a voltage rail; a series-shunt amplifier having: a pre-amplifier having a first input terminal, a second input terminal, a first output terminal, and a second output terminal, wherein the first and second input terminals of the pre-amplifier receives a differential input signal; a first inductor that is coupled between the voltage rail and the first output terminal; a second inductor that is coupled to between the voltage rail and the second output terminal; a third inductor that is coupled to the first output terminal; and a fourth inductor that is coupled to the second output terminal; and a latch that is coupled to the third and fourth inductors, wherein the latch is activated during a hold phase and deactivated during a track phase, wherein the latch includes: a first grounding transistor that is coupled between third inductor and ground so as to provide a first path to ground for the third inductor in the tracking phase; and a second grounding transistor that is coupled to fourth inductor and ground so as to provide a first path to ground for the third inductor in the tracking phase.

In accordance with a preferred embodiment of the present invention, the latch further comprises: a pair of cross-coupled transistors that are each coupled to the third and fourth inductors; and a switching transistor that is coupled to the pair of cross-coupled transistors, wherein the switching transistor receives a latching signal so as to activate the latch during the hold phase and deactivate the latch during the tracking phase.

In accordance with a preferred embodiment of the present invention, the series-shunt amplifier further comprises: a first resistor that is coupled between the first inductor and the first output terminal; and a second resistor that is coupled between the second inductor and the second output terminal.

In accordance with a preferred embodiment of the present invention, the pre-amplifier further comprises: a pair of differential input transistors that are each coupled to at least one of the first and second input terminals and to at least one of the first and second output terminals; and a bias transistor that is coupled to the pair of differential input transistors, wherein the bias transistor receives a bias voltage.

In accordance with a preferred embodiment of the present invention, an apparatus is provided. The apparatus comprises a first voltage rail; a second voltage rail; a first inductor that is coupled to the first voltage rail; a second inductor that is coupled to the first voltage rail; a first resistor that is coupled to the first inductor; a second resistor that is coupled to the second inductor; a pre-amplifier having: a first output terminal that is coupled to the first resistor; a second output terminal that is coupled to the second resistor; a first NMOS transistor that is coupled to the first output terminal at its drain and to the first voltage rail at its gate; a second NMOS transistor that is coupled to the second output terminal at its drain and to the first voltage rail at its gate; a third NMOS transistor that is coupled to the source of the first NMOS transistor at its drain and that receives a first portion of a differential input signal its gate; a fourth NMOS transistor that is coupled to the source of the second NMOS transistor at its drain and that receives a second portion of the differential input signal at its gate; and a fifth NMOS transistor that is coupled to the sources of the third and fourth NMOS transistors at its drain, that is coupled to the second voltage rail at its source, and that receives a bias voltage at its gate; a third inductor that is coupled to the first output terminal; and a fourth inductor that is coupled to the second output terminal; and a latch having: a sixth NMOS transistor that is coupled to the third inductor at its drain and to the fourth inductor at its gate; a seventh NMOS transistor that is coupled to the fourth inductor at its drain and to the third inductor at its gate; an eighth NMOS transistor that is coupled to the sources of the sixth and seventh NMOS transistors at its drain, that is coupled to the second voltage rail at its drain, and that receives a latch signal at its gate; a ninth NMOS transistor that is coupled to the third inductor at its drain, that is coupled to the second voltage rail at its source, and that receives an inverted latch signal at its gate; and a tenth NMOS transistor that is coupled to the fourth inductor at its drain, that is coupled to the second voltage rail at its source, and that receives the inverted latch signal at its gate.

In accordance with a preferred embodiment of the present invention, the ON resistance of the ninth NMOS transistor is greater than the resistance of the first resistor.

In accordance with a preferred embodiment of the present invention, the ON resistance of the tenth NMOS transistor is greater than the resistance of the second resistor.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
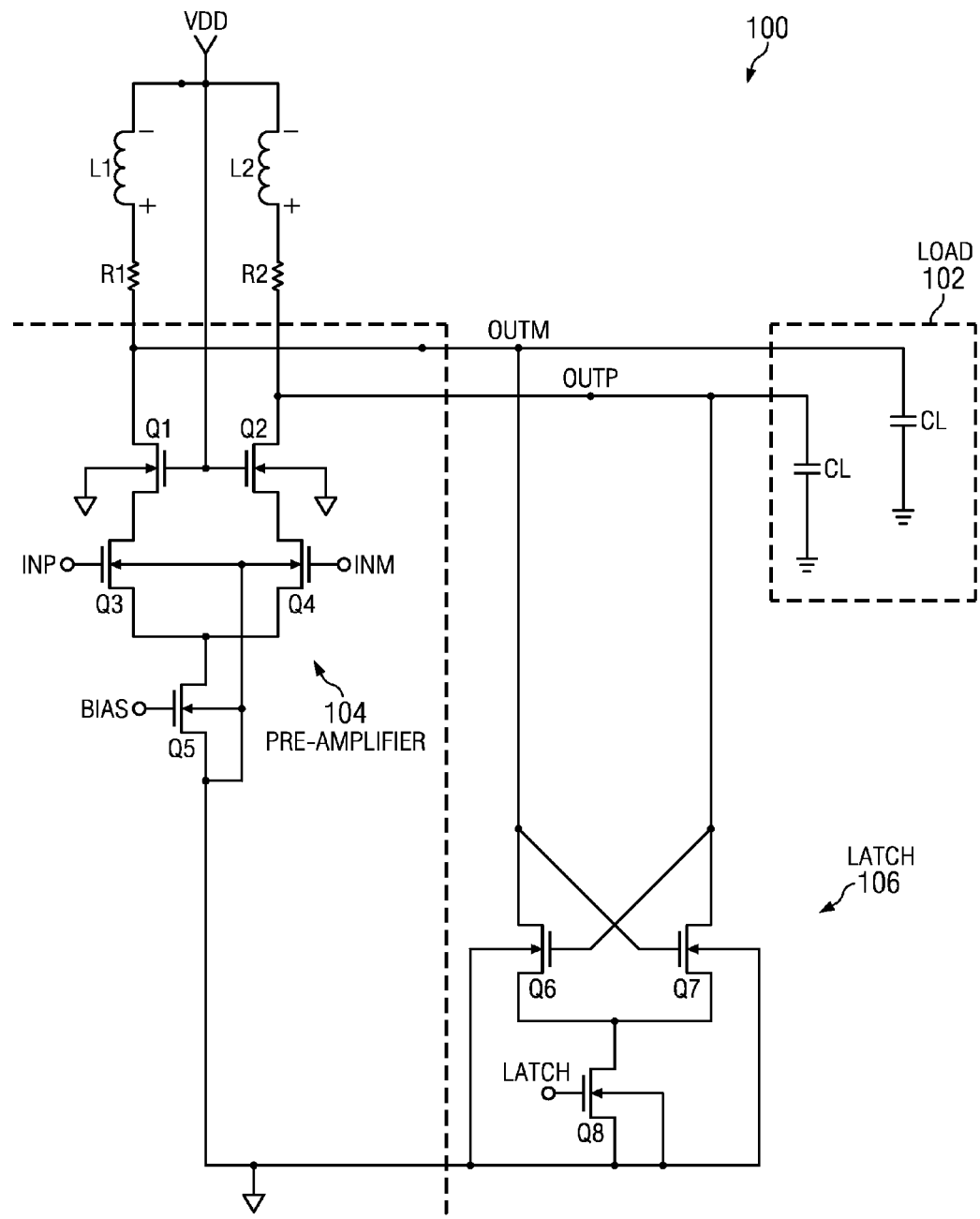
FIGS. 1 and 2 are circuit diagrams of examples of conventional latched comparators.
Figure 2:
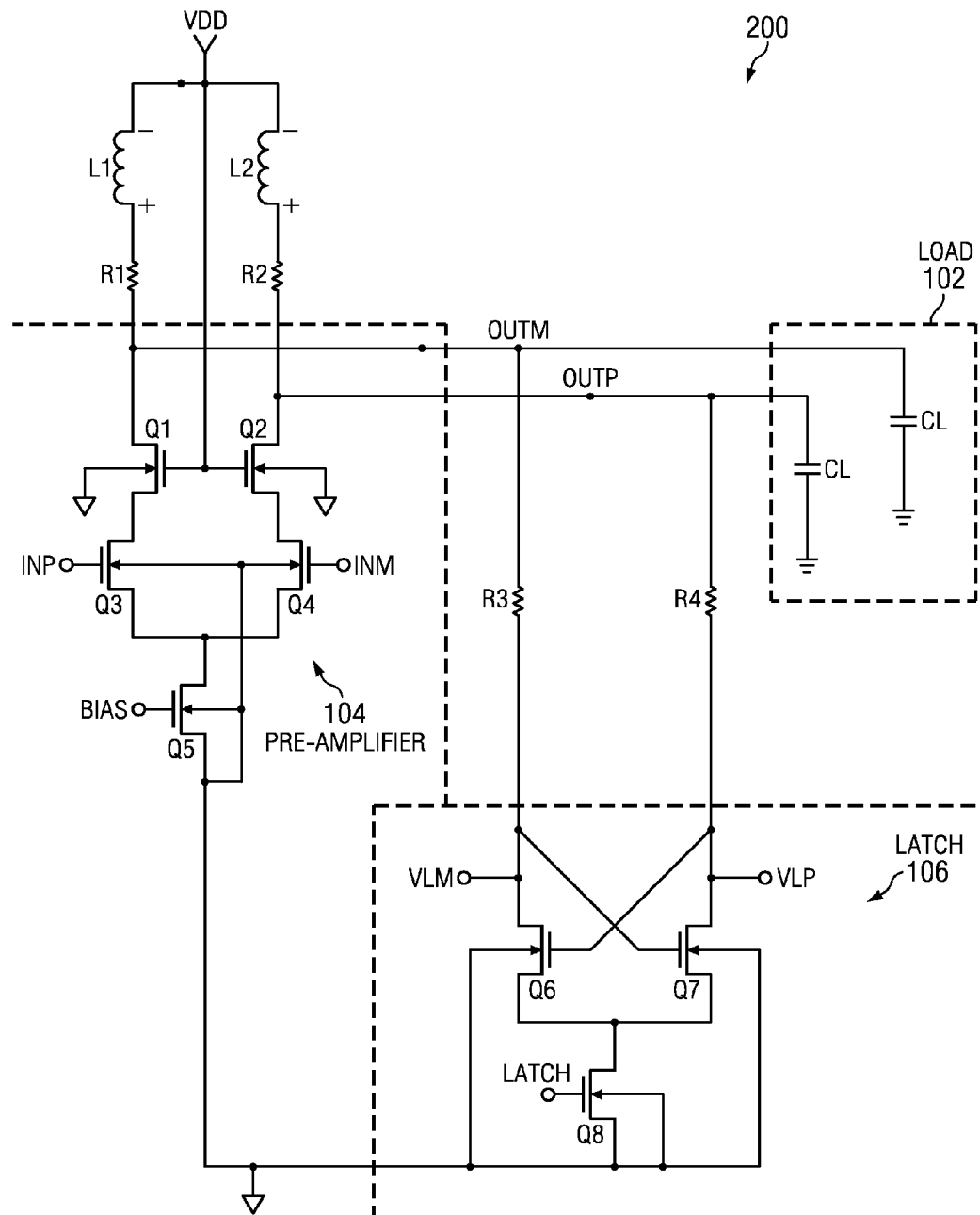

Refer now to the drawings wherein depicted elements are, for the sake of clarity, not necessarily shown to scale and wherein like or similar elements are designated by the same reference numeral through the several views.

Figure 3:
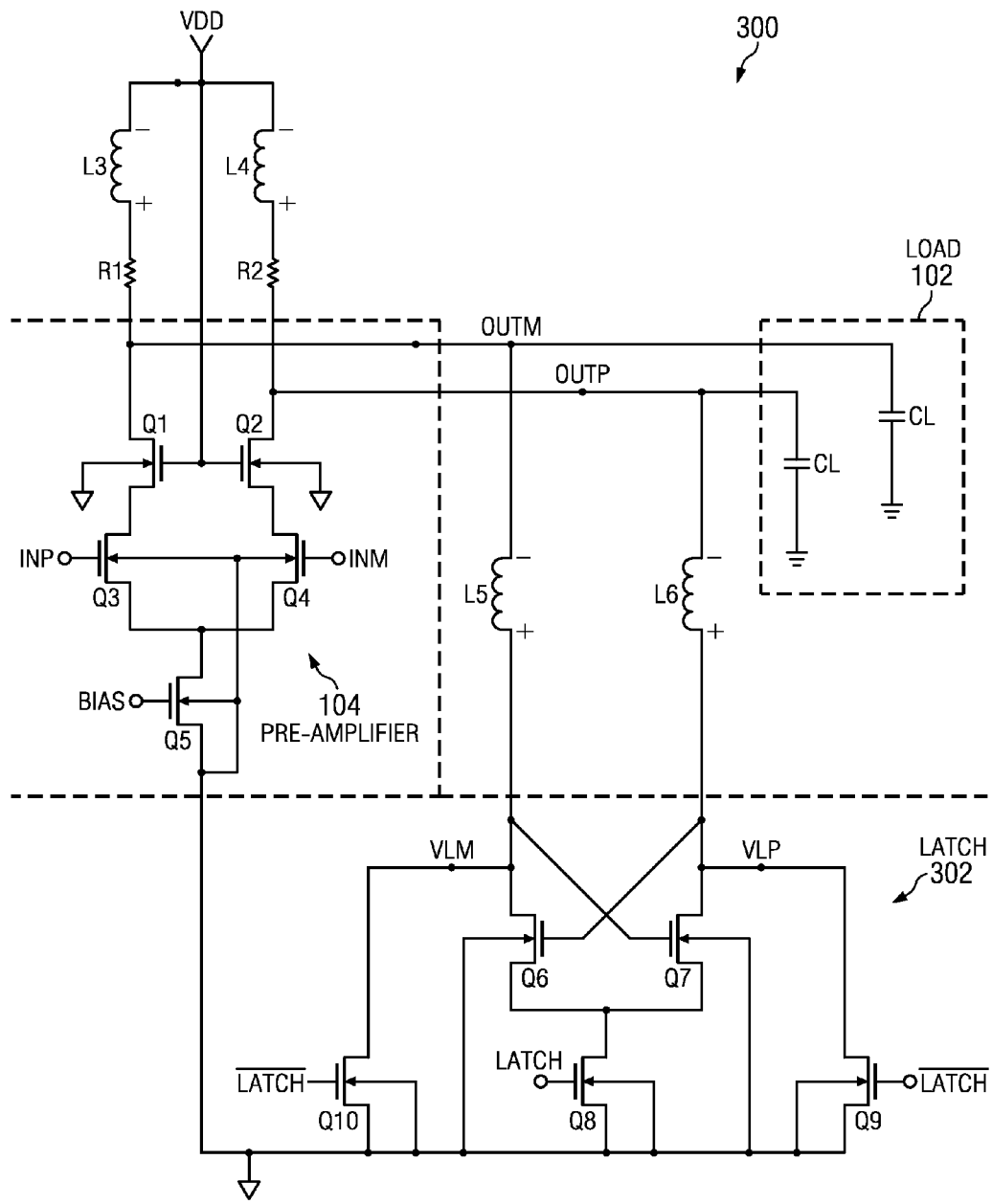
FIG. 3 is circuit diagram of an example of a latched comparator in accordance with a preferred embodiment of the present invention.

Turning to FIG. 3, an example of a latched comparator 300 in accordance with a preferred embodiment of the present invention can be seen. As shown, latched comparator 300 has a similar configuration to latched comparator 100; however, latched comparator 300 generally includes inductors L5 and L6, which are shown as being coupled between the output terminals of pre-amplifier 104 and the latch 302. Additionally, latch 302 generally includes grounding transistors Q10 and Q11 (which can be NMOS transistors) to accommodate inductors L5 and L6, and collectively, pre-amplifier 106 and inductors L3, L4, L5 and L6 operate as a series-shunt amplifier.

In operation, latched comparator 300 has similar functionality to latched comparator 100. Namely, during a track phase of latch signal LATCH, the latch 306 is deactivated, and the pre-amplifier 106 generates differential output signals OUTP and OUTM from differential input signals INP and INM. Additionally, inductors L3 and L4 can provide shunt peaking during this tracking phase. When the latch signal LATCH transitions from the track phase (logic low or "0") to the hold phase (logic high or "1"), switching transistor Q8 activates latch 302. Additionally, during this transition, inverted latch signal $\overline{\text{LATCH}}$ deactivates grounding transistors Q10 and Q11. Thus, during the hold phase of latch signal LATCH, inductors L5 and L6 can generally isolate the output terminals of latch 302 from load capacitances (i.e., capacitors CL). Then, when the latch signal LATCH transitions from the hold phase to the track phase, switching transistor Q8 deactivate latch 302, while inverted latch signal $\overline{\text{LATCH}}$ activates grounding transistors Q10 and Q11 so as to provide a path to ground for each of inductors L5 and L6.

As a result of this arrangement, several advantages can be realized. Because the series resistance for inductors L5 and L6 is much smaller than a configuration employing resistive isolation (i.e., resistors R3 and R4), there is a lower loss in voltage swing between latch 106 (i.e., the difference between voltages VLM and VLP) to the output terminals of pre-amplifier 104 (i.e., difference between signals OUTP and OUTM, which are generally voltages). Additionally, because the combined inductance of inductors L3/L5 and L4/L6 can be about the same as inductors L1 and L2, respectively, additionally losses due to increased inductances are not generally realized. Also, because the ON resistance of grounding transistors Q10 and Q11 is much larger than resistors R1 and R2, operation of the pre-amplifier 104 is generally not affected by grounding transistors Q10 and Q11.

To further illustrate the improvement in performance of latched comparator 300 over latched comparators 100 and 200, Table 1 is provided below. As shown, the power dissipation for latched comparator 300 is about the same as latched comparator 100, and the latch time constant for latched comparator 300 is lower than either of latched comparators 100 and 200. Additionally, power dissipation for latched comparator 200 is lower because of larger overall resistive load on the latch 106. The same power numbers can be achieved for latched comparators 100 and 300 as well without degradation in latch time constants, but there is generally a tradeoff between excess track bandwidth will power dissipation.

TABLE 1

| Latched Comparator | Time Constant (ps) | Power Dissipation (mW) |
| --- | --- | --- |
| 100 | 5 | 3.75 (mA)*1.35 (V) = 5.0625 mW |
| 200 | 3 | 3.046 (mA)*1.35 (V) = 4.1121 mW |
| 300 | 2.7 | 3.744 (mA)*1.35 (V) = 5.0544 mW |

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
a voltage rail;
a series-shunt amplifier having:
    a pre-amplifier having a first input terminal, a second input terminal, a first output terminal, and a second output terminal, wherein the first and second input terminals of the pre-amplifier receives a differential input signal;
    a first inductor that is coupled between the voltage rail and the first output terminal;
    a second inductor that is coupled to between the voltage rail and the second output terminal;
    a third inductor that is coupled to the first output terminal; and
    a fourth inductor that is coupled to the second output terminal; and
    a latch that is coupled to the third and fourth inductors, wherein the latch is activated during a hold phase and deactivated during a track phase, wherein the latch includes:
    a first grounding transistor that is coupled between third inductor and ground so as to provide a first path to ground for the third inductor in the tracking phase; and
    a second grounding transistor that is coupled to fourth inductor and ground so as to provide a second path to ground for the fourth inductor in the tracking phase.

2. The apparatus of claim 1, wherein the latch further comprises:
a pair of cross-coupled transistors that are each coupled to the third and fourth inductors; and
a switching transistor that is coupled to the pair of cross-coupled transistors, wherein the switching transistor receives a latching signal so as to activate the latch during the hold phase and deactivate the latch during the tracking phase.

3. The apparatus of claim 2, wherein the series-shunt amplifier further comprises:
a first resistor that is coupled between the first inductor and the first output terminal; and
a second resistor that is coupled between the second inductor and the second output terminal.

4. The apparatus of claim 3, wherein the pre-amplifier further comprises:
a pair of differential input transistors that are each coupled to at least one of the first and second input terminals and to at least one of the first and second output terminals; and
a bias transistor that is coupled to the pair of differential input transistors, wherein the bias transistor receives a bias voltage.

5. An apparatus comprising:
a first voltage rail;
a second voltage rail;
a first inductor that is coupled to the first voltage rail;
a second inductor that is coupled to the first voltage rail;
a first resistor that is coupled to the first inductor;
a second resistor that is coupled to the second inductor;
a pre-amplifier having:
    a first output terminal that is coupled to the first resistor;
    a second output terminal that is coupled to the second resistor;
    a first NMOS transistor that is coupled to the first output terminal at its drain and to the first voltage rail at its gate;
    a second NMOS transistor that is coupled to the second output terminal at its drain and to the first voltage rail at its gate;
    a third NMOS transistor that is coupled to the source of the first NMOS transistor at its drain and that receives a first portion of a differential input signal its gate;
    a fourth NMOS transistor that is coupled to the source of the second NMOS transistor at its drain and that receives a second portion of the differential input signal at its gate; and
    a fifth NMOS transistor that is coupled to the sources of the third and fourth NMOS transistors at its drain, that is coupled to the second voltage rail at its source, and that receives a bias voltage at its gate;
a third inductor that is coupled to the first output terminal; and
a fourth inductor that is coupled to the second output terminal; and
a latch having:
    a sixth NMOS transistor that is coupled to the third inductor at its drain and to the fourth inductor at its gate;
    a seventh NMOS transistor that is coupled to the fourth inductor at its drain and to the third inductor at its gate;
    an eighth NMOS transistor that is coupled to the sources of the sixth and seventh NMOS transistors at its drain, that is coupled to the second voltage rail at its drain, and that receives a latch signal at its gate;

a ninth NMOS transistor that is coupled to the third inductor at its drain, that is coupled to the second voltage rail at its source, and that receives an inverted latch signal at its gate; and a tenth NMOS transistor that is coupled to the fourth inductor at its drain, that is coupled to the second voltage rail at its source, and that receives the inverted latch signal at its gate.

6. The apparatus of claim 5, wherein the ON resistance of the ninth NMOS transistor is greater than the resistance of the first resistor.

7. The apparatus of claim 6, wherein the ON resistance of the tenth NMOS transistor is greater than the resistance of the second resistor.

* * * * *